United States Patent
Egan

(10) Patent No.: US 12,299,315 B2
(45) Date of Patent: May 13, 2025

(54) CODING FOR QUAD-LEVEL MEMORY CELLS HAVING A REPLACEMENT GATE CONFIGURATION

(71) Applicant: Micron Technology, Inc., Boise, ID (US)

(72) Inventor: Curtis Egan, Brighton, CO (US)

(73) Assignee: Micron Technology, Inc., Boise, ID (US)

( * ) Notice: Subject to any disclaimer, the term of this patent is extended or adjusted under 35 U.S.C. 154(b) by 156 days.

(21) Appl. No.: 17/883,075

(22) Filed: Aug. 8, 2022

(65) Prior Publication Data

US 2024/0045611 A1 Feb. 8, 2024

(51) Int. Cl.
*G11C 16/00* (2006.01)
*G06F 3/06* (2006.01)

(52) U.S. Cl.
CPC .......... *G06F 3/0655* (2013.01); *G06F 3/0604* (2013.01); *G06F 3/0679* (2013.01); *G11C 16/00* (2013.01)

(58) Field of Classification Search
CPC .... G06F 3/0655; G06F 3/0604; G06F 3/0679; G11C 16/00
See application file for complete search history.

(56) References Cited

U.S. PATENT DOCUMENTS

2021/0406121 A1* 12/2021 Sharon .................. G06F 3/0659
2022/0107751 A1* 4/2022 Gorobets ............ G11C 11/5628

* cited by examiner

*Primary Examiner* — Xiaochun L Chen
(74) *Attorney, Agent, or Firm* — Holland & Hart LLP

(57) ABSTRACT

Methods, systems, and devices for coding for quad-level memory cells having a replacement gate configuration are described. Data may be received for storage in a memory device that includes a memory array with memory cells having a replacement gate configuration. The data may be assigned to a plurality of different types of pages within a memory cell of the memory cells using a unit-distance code. The data may be written to the plurality of pages of the different types within the memory cell based at least in part on assigning the data to the plurality of pages of the different types within the memory cell using the unit-distance code to distribute the pages in a way to avoid inconsistent voltage shifting across the plurality of pages of different types.

20 Claims, 6 Drawing Sheets

New Gray Code
(3-4-4-4)

| Gate (pg) | Logic | T | X | U | L |
|---|---|---|---|---|---|
| | 0 | 0 | 0 | 0 | 0 |
| R1 (U) | 1 | 0 | 0 | 1 | 0 |
| R2 (X) | 2 | 0 | 1 | 1 | 0 |
| R3 (U) | 3 | 0 | 1 | 0 | 0 |
| R4 (T) | 4 | 1 | 1 | 0 | 0 |
| R5 (L) | 5 | 1 | 1 | 0 | 1 |
| R6 (T) | 6 | 0 | 1 | 0 | 1 |
| R7 (U) | 7 | 0 | 1 | 1 | 1 |
| R8 (X) | 8 | 0 | 0 | 1 | 1 |
| R9 (T) | 9 | 1 | 0 | 1 | 1 |
| R10 (X) | 10 | 1 | 1 | 1 | 1 |
| R11 (L) | 11 | 1 | 1 | 1 | 0 |
| R12 (X) | 12 | 1 | 0 | 1 | 0 |
| R13 (U) | 13 | 1 | 0 | 0 | 0 |
| R14 (L) | 14 | 1 | 0 | 0 | 1 |
| R15 (T) | 15 | 0 | 0 | 0 | 1 |

460  450  440  430  420  410

400

New Gray Code
(3-4-4-4)

| Gate (pg) | Logic | T | X | U | L |
|---|---|---|---|---|---|
|  | 0 | 0 | 0 | 0 | 0 |
| R1 (U) | 1 | 0 | 0 | 1 | 0 |
| R2 (X) | 2 | 0 | 1 | 1 | 0 |
| R3 (U) | 3 | 0 | 1 | 0 | 0 |
| R4 (T) | 4 | 1 | 1 | 0 | 0 |
| R5 (L) | 5 | 1 | 1 | 0 | 1 |
| R6 (T) | 6 | 0 | 1 | 0 | 1 |
| R7 (U) | 7 | 0 | 1 | 1 | 1 |
| R8 (X) | 8 | 0 | 0 | 1 | 1 |
| R9 (T) | 9 | 1 | 0 | 1 | 1 |
| R10 (X) | 10 | 1 | 1 | 1 | 1 |
| R11 (L) | 11 | 1 | 1 | 1 | 0 |
| R12 (X) | 12 | 1 | 0 | 1 | 0 |
| R13 (U) | 13 | 1 | 0 | 0 | 0 |
| R14 (L) | 14 | 1 | 0 | 0 | 1 |
| R15 (T) | 15 | 0 | 0 | 0 | 1 |

CODING FOR QUAD-LEVEL MEMORY CELLS HAVING A REPLACEMENT GATE CONFIGURATION

FIELD OF TECHNOLOGY

The following relates to one or more systems for memory, including coding for quad-level memory cells having a replacement gate configuration.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

BRIEF DESCRIPTION OF THE DRAWINGS

FIG. 4 shows a table illustrating binary values that support coding for quad-level memory cells having a replacement gate configuration in accordance with examples as disclosed herein.

DETAILED DESCRIPTION

Various coding schemes are implemented to store data in memory devices within memory systems. For example, unit-distance codes (such as gray codes) may be used to select voltage levels that are applied with memory devices having cells with multiple layers (such as a triple-level cell (TLC), a quad-level cell (QLC), etc.). Moreover, memory devices that incorporate a replacement gate design (e.g., NAND) may be relatively more susceptible to voltage shifts, resulting from charge loss, after data is written to a memory cell when compared to other designs, such as a floating gate design. For example, in a replacement gate design, voltage shifts for values on an upper end of a voltage threshold distribution (e.g., R11, R12, R13, R14, R15) may be substantial and much more severe than voltage shifts for values on a lower end of a voltage threshold distribution (e.g., R1, R2, R3, R4, R5). Such voltage shifts due to charge loss can lead to higher bit error rates and other disadvantages—especially for higher voltage threshold levels in multi-level cell example, including QLC examples.

Methods, systems, and devices for improving the distribution of different page types are described. The improvements include relatively lower and better distributed geographic means for the different page types in the voltage threshold distributions. The improved unit-distance/Gray code schemes are disclosed and avoid clustering one or more subsets of the page types (such as a top page) in the memory cell at higher voltage threshold levels that may be more susceptible to voltage shifting and higher raw bit error rate (RBER). Among other advantages, these techniques reduce the overall RBER by balancing the probability of errors across the different page types, and accounting for potential asymmetric voltage shifts that can occur in replacement gate designs (among other examples) and would otherwise inconsistently affect pages of different types (e.g., affect top pages disproportionately compared to extra pages, upper pages, and lower pages).

Figure 1:
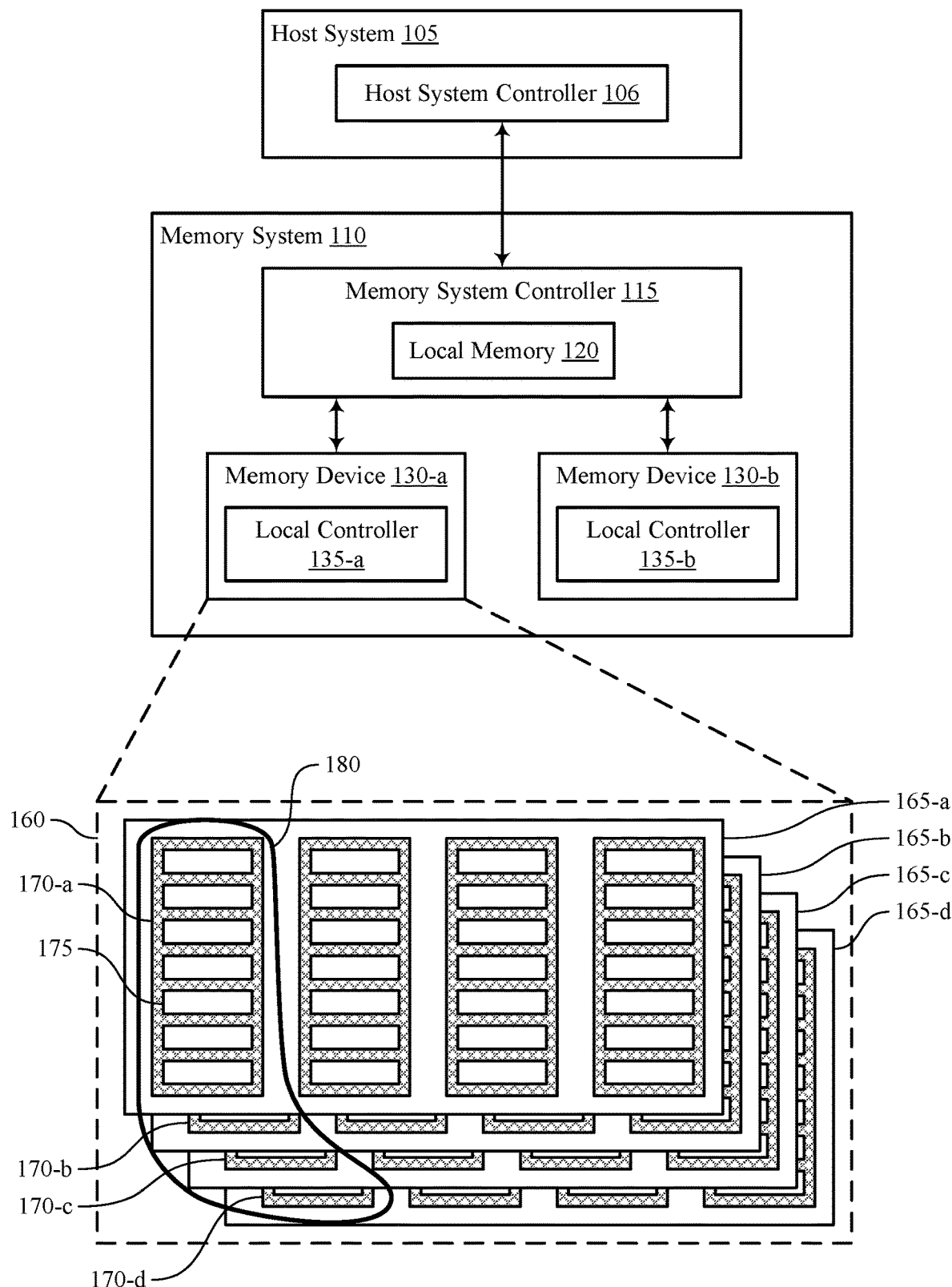
FIG. 1 illustrates an example of a system that supports coding for quad-level memory cells having a replacement gate configuration in accordance with examples as disclosed herein.
Figure 2:
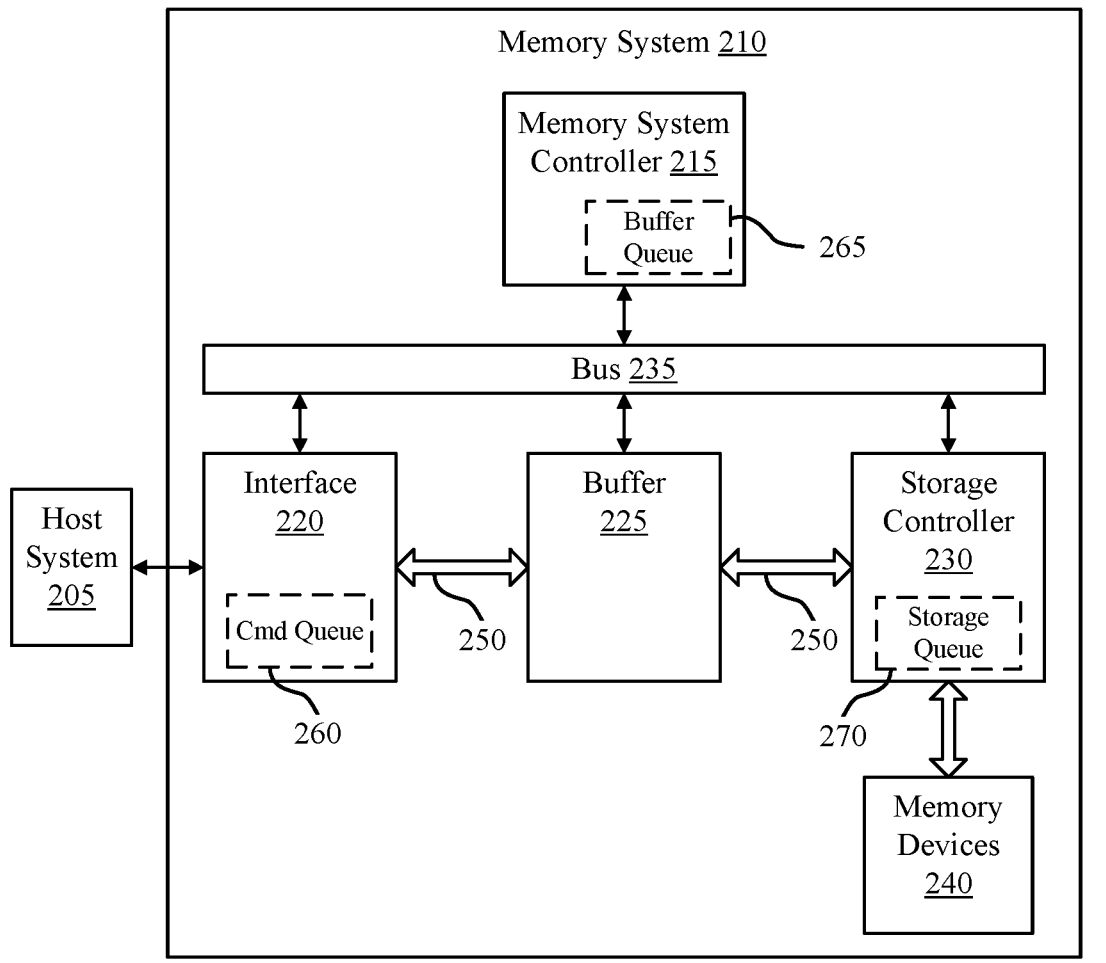
FIG. 2 illustrates an example of a system that supports coding for quad-level memory cells having a replacement gate configuration in accordance with examples as disclosed herein.

Features of the disclosure are initially described in the context of systems, devices, and circuits with reference to FIGS. 1 through 2. Features of the disclosure are described in the context of a voltage threshold distribution and coding logic states with reference to FIGS. 3 and 4. These and other features of the disclosure are further illustrated by and described in the context of an apparatus diagram and flowchart that relate to coding for quad-level memory cells having a replacement gate configuration with reference to FIGS. 5 and 6.

FIG. 1 illustrates an example of a system 100 that supports coding for quad-level memory cells having a replacement gate configuration in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally, or alternatively, include static random access memory (SRAM) or other memory that may be used by the memory system controller 115 for internal storage or calculations, for example, related to the functions ascribed herein to the memory system controller 115. Additionally, or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally, or alternatively, rely on an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally, or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a die 160 (e.g., a memory die). For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally, or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may be performed on different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165-c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-a and memory device 130-b). In some cases, the blocks 170 within a virtual block may have the same block address within their respective planes 165 (e.g., block 170-a may be "block 0" of plane 165-a, block 170-b may be "block 0" of plane 165-b, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

The system 100 may include any quantity of non-transitory computer readable media that support coding for quad-level memory cells having a replacement gate configuration. For example, the host system 105 (e.g., a host system controller 106), the memory system 110 (e.g., a memory system controller 115), or a memory device 130 (e.g., a local controller 135) may include or otherwise may access one or more non-transitory computer readable media storing instructions (e.g., firmware, logic, code) for performing the functions ascribed herein to the host system 105, the memory system 110, or a memory device 130. For example, such instructions, if executed by the host system 105 (e.g., by a host system controller 106), by the memory system 110 (e.g., by a memory system controller 115), or by a memory device 130 (e.g., by a local controller 135), may cause the host system 105, the memory system 110, or the memory device 130 to perform associated functions as described herein.

In some examples, the memory system 110 may receive data for storage in one or more memory devices 130 that include memory arrays with memory cells having a replacement gate configuration. The memory system 110 may apply a unit-distance code to assign the data to different pages within the memory cells. The unit-distance code allows the data to be encoded in such a manner that a only one-bit change occurs between a representation of adjacent pages. The memory device 130 may write the pages within the memory cells based on the data assignment. The pages are written in such a manner that a geographic mean of one or more selected page types having distributions in a higher voltage threshold region of each memory cell using a second unit-distance code is shifted to distributions in a lower voltage threshold region of the memory cell.

FIG. 2 illustrates an example of a system 200 that supports coding for quad-level memory cells having a replacement gate configuration in accordance with examples as disclosed herein. The system 200 may be an example of a system 100 as described with reference to FIG. 1, or aspects thereof. The system 200 may include a memory system 210 configured to store data received from the host system 205 and to send data to the host system 205, if requested by the host system 205 using access commands (e.g., read commands or write commands). The system 200 may implement aspects of the system 100 as described with reference to FIG. 1. For example, the memory system 210 and the host system 205 may be examples of the memory system 110 and the host system 105, respectively.

The memory system 210 may include one or more memory devices 240 to store data transferred between the memory system 210 and the host system 205 (e.g., in response to receiving access commands from the host system 205). The memory devices 240 may include one or more memory devices as described with reference to FIG. 1. For example, the memory devices 240 may include NAND memory, PCM, self-selecting memory, 3D cross point or other chalcogenide-based memories, FERAM, MRAM, NOR (e.g., NOR flash) memory, STT-MRAM, CBRAM, RRAM, or OxRAM, among other examples.

The memory system 210 may include a storage controller 230 for controlling the passing of data directly to and from the memory devices 240 (e.g., for storing data, for retrieving data, for determining memory locations in which to store data and from which to retrieve data). The storage controller 230 may communicate with memory devices 240 directly or via a bus (not shown), which may include using a protocol specific to each type of memory device 240. In some cases, a single storage controller 230 may be used to control multiple memory devices 240 of the same or different types. In some cases, the memory system 210 may include multiple storage controllers 230 (e.g., a different storage controller 230 for each type of memory device 240). In some cases, a storage controller 230 may implement aspects of a local controller 135 as described with reference to FIG. 1.

The memory system 210 may include an interface 220 for communication with the host system 205, and a buffer 225 for temporary storage of data being transferred between the host system 205 and the memory devices 240. The interface 220, buffer 225, and storage controller 230 may support translating data between the host system 205 and the memory devices 240 (e.g., as shown by a data path 250), and may be collectively referred to as data path components.

Using the buffer 225 to temporarily store data during transfers may allow data to be buffered while commands are being processed, which may reduce latency between commands and may support arbitrary data sizes associated with commands. This may also allow bursts of commands to be handled, and the buffered data may be stored, or transmitted, or both (e.g., after a burst has stopped). The buffer 225 may include relatively fast memory (e.g., some types of volatile memory, such as SRAM or DRAM), or hardware accelerators, or both to allow fast storage and retrieval of data to and from the buffer 225. The buffer 225 may include data path switching components for bi-directional data transfer between the buffer 225 and other components.

A temporary storage of data within a buffer 225 may refer to the storage of data in the buffer 225 during the execution of access commands. For example, after completion of an access command, the associated data may no longer be maintained in the buffer 225 (e.g., may be overwritten with data for additional access commands). In some examples, the buffer 225 may be a non-cache buffer. For example, data may not be read directly from the buffer 225 by the host system 205. In some examples, read commands may be added to a queue without an operation to match the address to addresses already in the buffer 225 (e.g., without a cache address match or lookup operation).

The memory system 210 also may include a memory system controller 215 for executing the commands received from the host system 205, which may include controlling the data path components for the moving of the data. The memory system controller 215 may be an example of the memory system controller 115 as described with reference to FIG. 1. A bus 235 may be used to communicate between the system components.

In some cases, one or more queues (e.g., a command queue 260, a buffer queue 265, a storage queue 270) may be used to control the processing of access commands and the movement of corresponding data. This may be beneficial, for example, if more than one access command from the host system 205 is processed concurrently by the memory system 210. The command queue 260, buffer queue 265, and storage queue 270 are depicted at the interface 220, memory system controller 215, and storage controller 230, respectively, as examples of a possible implementation. However, queues, if implemented, may be positioned anywhere within the memory system 210.

Data transferred between the host system 205 and the memory devices 240 may be conveyed along a different path in the memory system 210 than non-data information (e.g., commands, status information). For example, the system components in the memory system 210 may communicate with each other using a bus 235, while the data may use the data path 250 through the data path components instead of the bus 235. The memory system controller 215 may control how and if data is transferred between the host system 205 and the memory devices 240 by communicating with the data path components over the bus 235 (e.g., using a protocol specific to the memory system 210).

If a host system 205 transmits access commands to the memory system 210, the commands may be received by the interface 220 (e.g., according to a protocol, such as a UFS protocol or an eMMC protocol). Thus, the interface 220 may be considered a front end of the memory system 210. After receipt of each access command, the interface 220 may communicate the command to the memory system controller 215 (e.g., via the bus 235). In some cases, each command may be added to a command queue 260 by the interface 220 to communicate the command to the memory system controller 215.

The memory system controller 215 may determine that an access command has been received based on the communication from the interface 220. In some cases, the memory system controller 215 may determine the access command has been received by retrieving the command from the command queue 260. The command may be removed from the command queue 260 after it has been retrieved (e.g., by the memory system controller 215). In some cases, the memory system controller 215 may cause the interface 220 (e.g., via the bus 235) to remove the command from the command queue 260.

After a determination that an access command has been received, the memory system controller 215 may execute the access command. For a read command, this may include obtaining data from one or more memory devices 240 and transmitting the data to the host system 205. For a write command, this may include receiving data from the host system 205 and moving the data to one or more memory devices 240. In either case, the memory system controller 215 may use the buffer 225 for, among other things, temporary storage of the data being received from or sent to the host system 205. The buffer 225 may be considered a middle end of the memory system 210. In some cases, buffer address management (e.g., pointers to address locations in the buffer 225) may be performed by hardware (e.g., dedicated circuits) in the interface 220, buffer 225, or storage controller 230.

To process a write command received from the host system 205, the memory system controller 215 may determine if the buffer 225 has sufficient available space to store the data associated with the command. For example, the memory system controller 215 may determine (e.g., via firmware, via controller firmware), an amount of space within the buffer 225 that may be available to store data associated with the write command.

In some cases, a buffer queue 265 may be used to control a flow of commands associated with data stored in the buffer 225, including write commands. The buffer queue 265 may include the access commands associated with data currently stored in the buffer 225. In some cases, the commands in the command queue 260 may be moved to the buffer queue 265 by the memory system controller 215 and may remain in the buffer queue 265 while the associated data is stored in the buffer 225. In some cases, each command in the buffer queue 265 may be associated with an address at the buffer 225. For example, pointers may be maintained that indicate where in the buffer 225 the data associated with each command is stored. Using the buffer queue 265, multiple access commands may be received sequentially from the host system 205 and at least portions of the access commands may be processed concurrently.

If the buffer 225 has sufficient space to store the write data, the memory system controller 215 may cause the interface 220 to transmit an indication of availability to the host system 205 (e.g., a "ready to transfer" indication), which may be performed in accordance with a protocol (e.g., a UFS protocol, an eMMC protocol). As the interface 220 receives the data associated with the write command from the host system 205, the interface 220 may transfer the data to the buffer 225 for temporary storage using the data path 250. In some cases, the interface 220 may obtain (e.g., from the buffer 225, from the buffer queue 265) the location within the buffer 225 to store the data. The interface 220 may indicate to the memory system controller 215 (e.g., via the bus 235) if the data transfer to the buffer 225 has been completed.

After the write data has been stored in the buffer 225 by the interface 220, the data may be transferred out of the buffer 225 and stored in a memory device 240, which may involve operations of the storage controller 230. For example, the memory system controller 215 may cause the storage controller 230 to retrieve the data from the buffer 225 using the data path 250 and transfer the data to a memory device 240. The storage controller 230 may be considered a back end of the memory system 210. The storage controller 230 may indicate to the memory system controller 215 (e.g., via the bus 235) that the data transfer to one or more memory devices 240 has been completed.

In some cases, a storage queue 270 may support a transfer of write data. For example, the memory system controller 215 may push (e.g., via the bus 235) write commands from the buffer queue 265 to the storage queue 270 for processing. The storage queue 270 may include entries for each access command. In some examples, the storage queue 270 may additionally include a buffer pointer (e.g., an address) that may indicate where in the buffer 225 the data associated with the command is stored and a storage pointer (e.g., an address) that may indicate the location in the memory devices 240 associated with the data. In some cases, the storage controller 230 may obtain (e.g., from the buffer 225, from the buffer queue 265, from the storage queue 270) the location within the buffer 225 from which to obtain the data. The storage controller 230 may manage the locations within the memory devices 240 to store the data (e.g., performing wear-leveling, performing garbage collection). The entries may be added to the storage queue 270 (e.g., by the memory system controller 215). The entries may be removed from the storage queue 270 (e.g., by the storage controller 230, by the memory system controller 215) after completion of the transfer of the data.

To process a read command received from the host system 205, the memory system controller 215 may determine if the buffer 225 has sufficient available space to store the data associated with the command. For example, the memory system controller 215 may determine (e.g., via firmware, via controller firmware), an amount of space within the buffer 225 that may be available to store data associated with the read command.

In some cases, the buffer queue 265 may support buffer storage of data associated with read commands in a similar manner as discussed with respect to write commands. For example, if the buffer 225 has sufficient space to store the read data, the memory system controller 215 may cause the storage controller 230 to retrieve the data associated with the read command from a memory device 240 and store the data in the buffer 225 for temporary storage using the data path 250. The storage controller 230 may indicate to the memory system controller 215 (e.g., via the bus 235) when the data transfer to the buffer 225 has been completed.

In some cases, the storage queue 270 may be used to aid with the transfer of read data. For example, the memory system controller 215 may push the read command to the storage queue 270 for processing. In some cases, the storage controller 230 may obtain (e.g., from the buffer 225, from the storage queue 270) the location within one or more memory devices 240 from which to retrieve the data. In some cases, the storage controller 230 may obtain (e.g., from the buffer queue 265) the location within the buffer 225 to store the data. In some cases, the storage controller 230 may obtain (e.g., from the storage queue 270) the location within the buffer 225 to store the data. In some cases, the memory system controller 215 may move the command processed by the storage queue 270 back to the command queue 260.

Once the data has been stored in the buffer 225 by the storage controller 230, the data may be transferred from the buffer 225 and sent to the host system 205. For example, the memory system controller 215 may cause the interface 220 to retrieve the data from the buffer 225 using the data path 250 and transmit the data to the host system 205 (e.g., according to a protocol, such as a UFS protocol or an eMMC protocol). For example, the interface 220 may process the command from the command queue 260 and may indicate to the memory system controller 215 (e.g., via the bus 235) that the data transmission to the host system 205 has been completed.

The memory system controller 215 may execute received commands according to an order (e.g., a first-in-first-out order, according to the order of the command queue 260). For each command, the memory system controller 215 may cause data corresponding to the command to be moved into and out of the buffer 225, as discussed herein. As the data is moved into and stored within the buffer 225, the command may remain in the buffer queue 265. A command may be removed from the buffer queue 265 (e.g., by the memory system controller 215) if the processing of the command has been completed (e.g., if data corresponding to the access command has been transferred out of the buffer 225). If a command is removed from the buffer queue 265, the address previously storing the data associated with that command may be available to store data associated with a new command.

In some examples, the memory system controller 215 may be configured for operations associated with one or more memory devices 240. For example, the memory system controller 215 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., LBAs) associated with commands from the host system 205 and physical addresses (e.g., physical block addresses) associated with memory cells within the memory devices 240. For example, the host system 205 may issue commands indicating one or more LBAs and the memory system controller 215 may identify one or more physical block addresses indicated by the LBAs. In some cases, one or more contiguous LBAs may correspond to noncontiguous physical block addresses. In some cases, the storage controller 230 may be configured to perform one or more of the described operations in conjunction with or instead of the memory system controller 215. In some cases, the memory system controller 215 may perform the functions of the storage controller 230 and the storage controller 230 may be omitted.

In some examples, the memory system 210 may receive data from the host system 205. The memory system 210 may store the data in the memory devices 240. In some examples, each of the memory devices 240 may include memory arrays with memory cells having a replacement gate configuration. The memory system 210 may apply a unit-distance code to assign the data to different pages within the memory cells. In some examples, the memory system 210 may scramble the data by randomly distributing it within the different pages. The memory device 240 may write the pages within the memory cells based on the data assignment made by the memory system 210. In some examples, the memory device 240 may apply the unit-distance code to assign the data to the different pages.

Figure 3:
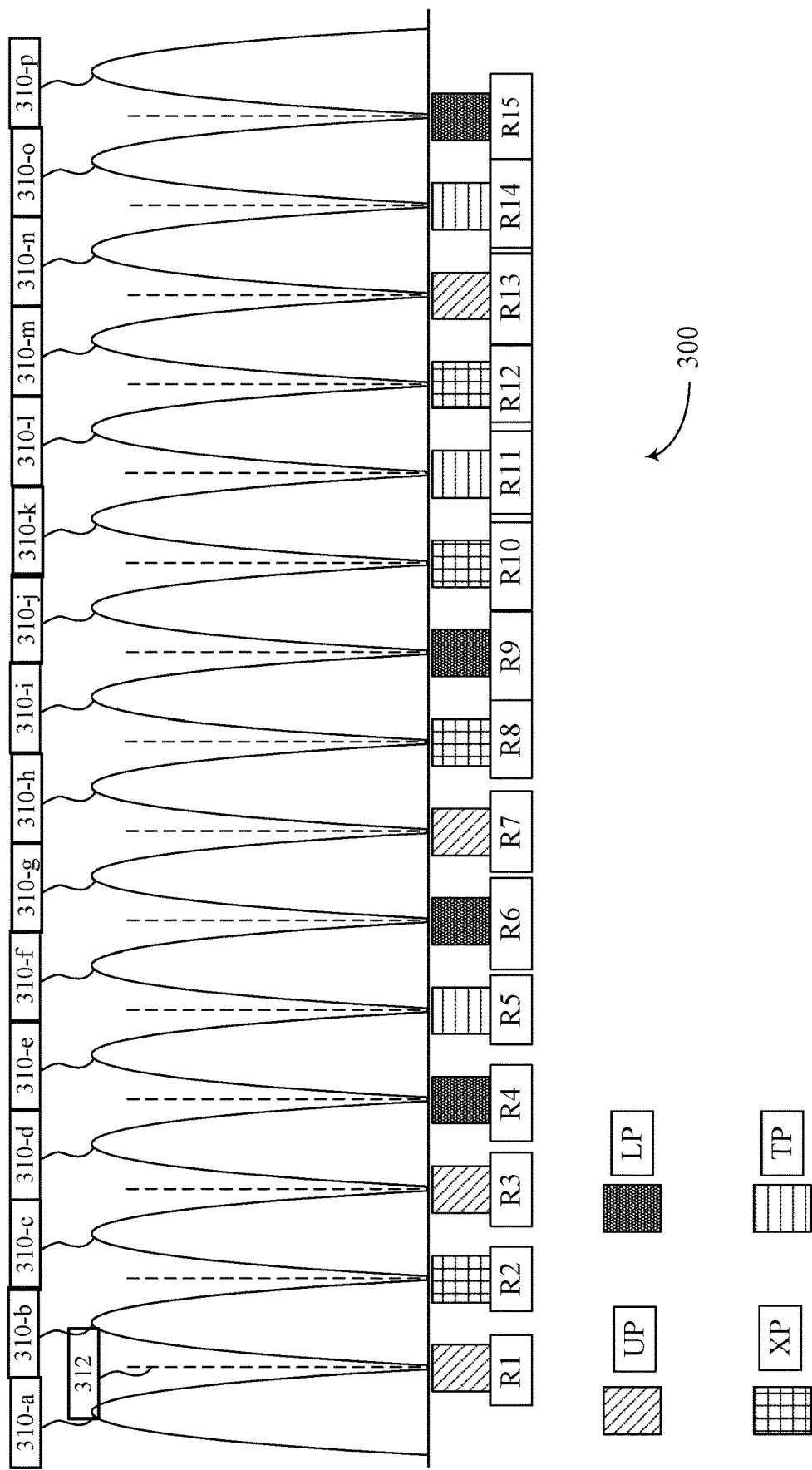
FIG. 3 illustrates a voltage threshold distribution for quad-level memory cells having a replacement gate configuration in accordance with examples as disclosed herein.

FIG. 3 illustrates a voltage threshold (Vt) distribution 300 for quad-level memory cells having a replacement gate configuration in accordance with examples as disclosed herein. According to the illustrated example, sixteen states 310-a through 310-p (collectively states 310) can be represented for the quad-level memory cell configured to store four bits of information. The Vt distribution 300 also shows fifteen threshold levels corresponding to unique voltage levels that activate replacement gates (R1-R15) when applied. The replacement gates R1-R15 may, in some examples, be associated with different page types of the memory cell. For example, a first subset of the replacement gates R1-R15 may be associated with a first page type, a second subset of the replacement gates R1-R15 may be associated with a second page type, a third subset of the replacement gates R1-R15 may be associated with a third page type, and a fourth subset of the replacement gates R1-R15 may be associated with a fourth page type. In some examples, each bit of a quad-level memory cell may be associated with a respective page type such as a top page (TP), extra page (XP), upper page (UP), and lower page (LP), among other examples.

In some examples, the Vt distribution 300 may be representative of voltage range (e.g., control voltages) such as 0V-5V. In some examples, a lower range (e.g., 0V to 2.5V) may be used with the first eight threshold levels, while a higher voltage range (e.g., 2.5V to may be used with the remaining seven threshold levels. Each replacement gate R1-R15 can be controlled to determine logic states through application of specific threshold voltages at the corresponding voltage lines 312. For example, replacement gate R1 will either conduct or not conduct when the threshold voltage corresponding to the voltage line 312 is applied (e.g., when replacement gate R1 is strobed). If replacement gate R1 conducts, then the first state 310-a is applicable. If replacement gate R1 does not conduct, then the first state 310-a is not applicable and the second state 310-b is applicable. Similarly, if the corresponding threshold voltage is applied to replacement gate R2 and it conducts (e.g., when replacement gate R2 is strobed), then the second state 310-b is applicable. If replacement gate R2 does not conduct, then the second state 310-b is not applicable and the third state 310-c is applicable. Thus, in some examples, the strobe may be a test of the threshold at a given gate voltage to determine if the bit is conductive or non-conductive.

According to the examples disclosed herein, a unit-distance code such as a gray code is used to map the different states of the quad-layer memory cells. The gray code mapping is a representation, such as a binary representation, where only one bit changes for each increment or decrement in value. For example, a single bit change occurs when transitioning from the second state 310-b to the third state 310-c (and vice versa). Similarly, a single bit change occurs when transitioning from the second state 310-b to the first state 310-a (and vice versa). Hence, the gray code may limit an error to a single bit if the bit is improperly decoded. The threshold voltages can be mapped to one of $2^X$ levels, where X represents the number of bits used to store information in the memory cell. Accordingly, a four bit gray code can be used to map the sixteen different states 310.

The memory cell may use different types of pages for storing information. According to an example, memory device 240 may include one or more quad-layer memory cells that each store four bits of data. Data may be included in respective page types (e.g., TP, XP, UP, and LP). Each memory cell may include a set of wordlines that correspond to a respective set of at least four pages (e.g., a TP, XP, UP, and LP). Each wordline may be coupled with a respective set of memory cells, each memory cell may be operable to store at least four bits of information. Each of the four bits may be included in a respective page of the respective set of at least four pages. In some examples, the most significant bit (MSB) may be included in a TP, the second MSB may be included in an XP, the third MSB may be included in a UP, and the fourth MSG, which may be the least significant bit (LSB), may be included in an LP (e.g., according to the gray code).

According to the examples disclosed herein, the Vt distribution 300 may represent a distribution of pages within memory cells of the memory device 240. Accordingly, each state 310 may represent the distribution of a particular page type within the memory devices 240. Each individual distribution may contain many (tens, hundreds, thousands, etc.) cells for a given page type. FIG. 3 may not be shown to scale to allow for clearer illustration and description. For example, the voltage curves used to represent different states 310 and the distance between adjacent threshold voltage lines 312 may be relatively smaller (or larger) than shown, many times plotted in log linear relationships. The voltage curves of adjacent states 310 may overlap in some examples. The Vt distribution 300 may implement aspects of a system 100 or a system 200 as described with reference to FIGS. 1 and 2. For example, a memory device, such as a memory device 130 or a memory device 240, may use voltages according to the Vt distribution 300.

The number of read strobes required to decode the bits for a particular state may vary based upon the specific gray code used to encode the states as well as the page type being read. In one example, memory cells encoded in accordance with another different gray code of 4-4-3-4 (going from LSB to MSB) may require four strobes to decode the bit corresponding to the TP, three strobes to decode the bit corresponding to the XP, and four strobes to decode the bit corresponding to each of the UP and LP. The resulting states 310 may be encoded with the following sixteen logic states: 1111, 1110, 1010, 1000, 1001, 0001, 0000, 0010, 0110, 0100, 1100, 0101, 0111, 0011, 1011. If the transition from state 310-*e* (logic state 1001) to 310-*f* (logic state 0001) requires a change in the bit corresponding to the TP (e.g., most significant bit), then one or more (e.g., one, two, three, four) read strobes would be applied to the NAND gate R5 (e.g., replacement gate R5).

User data may be scrambled during write operations to the memory device 240 by randomly distributing the data within different pages of the memory cells. In order to reduce the RBER, an equal distribution of the memory cells storing pages containing the data. The other different gray code (4-4-3-4) resulted in logic state changes that caused the following NAND gate assignments:

TP=R5, R10, R12, R15
XP=R2, R8, R14
UP=R3, R7, R9, R13
LP=R1, R4, R6, R11

As can be seen, three of the TP assignments occur at the higher NAND gates of the Vt distribution, namely R10, R12, and R15. The location of these NAND gates along the Vt distribution 300, however, results in higher RBER because they are in a region where the threshold voltage has the greatest charge loss. This charge loss, which may be known as slow charge loss, occurs proportionately with respect to a location in the vicinity of state 310-*c*. The charge loss causes a drift in the location of the states 310 in the Vt distribution 300 depending on distance from state 310-*c*. In contrast to floating gate designs, replacement gate designs exhibit significant movement in particular for the upper Vt distribution 300 end. For example, state 310-*p* (TP) may substantially move from its original location of approximately 5V. This movement can cause the voltage curves defining state 310-*p* and 310-*o* to shift down, widen and overlap the adjacent state, thereby resulting in relatively higher error counts. Furthermore, all defined states will shift and widen to a lesser extent as the voltage (e.g., charge level) decreases. Such movements will create a higher probability of read errors, among other issues. According to the examples described herein, a novel gray code of 3-4-4-4 is provided to reduce the RBER associated with the memory cell, among other benefits. This is accomplished, at least in part, by moving (e.g., redistributing) certain types of pages (e.g., TP, XP, UP, LP) to achieve an improved relative geographic mean for all pages of the Vt distribution 300. The result is a bit error rate that is better distributed (e.g., roughly even) across all states 310 related to the various types of pages. In one example, the new gray code (3-4-4-4) will require three strobes for the LP, four strobes for the UP, four strobes for the XP, and four strobes for the TP. The new gray code, in some examples, may produce the following sixteen logic states: 0000, 0010, 0110, 0100, 1100, 1101, 0101, 0111, 0011, 1011, 1111, 1110, 1010, 1000, 1001, 0001.

The new gray code (3-4-4-4) may provide logic state changes that result in the following NAND strobes for the given page (as shown in FIG. 3 and FIG. 4):

TP=R4, R6, R9, R15
XP=R2, R8, R10, R12
UP=R1, R3, R7, R13
LP=R5, R11, R14

In contrast to other different gray codes, such as the gray code (4-4-3-4), only two TP assignments occur at the higher NAND (R15 and R9), and only one TP assignment occurs at the highest six NAND gates (R10-R15). Furthermore, the other page assignments (XP, UP, LP) are modified to achieve a more balanced distribution across different page types resulting in more consistent and effective coding. In some examples, only three occurrences of the LP may occur in the Vt distribution 300.

FIG. 4 shows a table 400 illustrating binary values for a new gray code scheme that supports coding for quad-level memory cells having a replacement gate configuration in accordance with examples as disclosed herein. The table 400 includes four columns that represent bits from the new gray code matched to page bit assignments for the memory cell. Specifically, the table 400 includes a first column 410 that is matched to a first page type (e.g., the LP) of the memory cell, a second column 420 that is matched to a second page type (e.g., the UP) of the memory cell, a third column 430 that is matched to a third page type (e.g., the XP) of the memory cell, and a fourth column 440 that is matched to a fourth page type (e.g., the TP) of the memory cell. The table 400 also includes a fifth column 450 that identifies each of the sixteen logic states defined by the new gray code. The table 400 further includes a sixth column 460 which identifies the NAND gate (R1-R15) affected by the transition between logic states in column 450. The sixth column 460 also identifies the page type selected by the NAND gate (R1-R15).

According to the illustrated example, logic state zero is defined by gray code bits 0000, which correspond to the binary values in columns 410, 420, 430, and 440. At logic state one, the binary value in column 420 transitions from 0 to 1. This corresponds to the UP of the memory cell. At logic state two in column 450, the binary value in column 430 transitions from 0 to 1, corresponding to the XP of the memory cell. At logic state three in column 450, the binary value in column 420 transitions from 1 to 0, corresponding to the UP of the memory cell. At logic state four in column 450, the binary value in column 440 transitions from 0 to 1, corresponding to the TP of the memory cell. At logic state five in column 450, the binary value in column 410 transitions from 0 to 1, corresponding to the LP of the memory cell. At logic state six in column 450, the binary value in column 440 transitions from 0 to 1, corresponding to the TP of the memory cell. At logic state seven in column 450, the binary value in column 420 transitions from 0 to 1, corresponding to the UP of the memory cell. At logic state eight in column 450, the binary value in column 430 transitions from 1 to 0, corresponding to the XP of the memory cell. At logic state 9 in column 450, the binary value in column 440 transitions from 0 to 1, corresponding to the TP of the memory cell. At logic state ten in column 450, the binary value in column 430 transitions from 0 to 1, corresponding to the XP of the memory cell. At logic state eleven in column 450, the binary value in column 410 transitions from 1 to 0, corresponding to the LP of the memory cell. At logic state twelve in column 450, the binary value in column 430 transitions from 1 to 0, corresponding to the XP of the memory cell. At logic state thirteen in column 450, the binary value in column 420 transitions from 1 to 0, corresponding to the UP of the memory cell. At logic state fourteen in column 450, the binary value in column 410 transitions from 0 to 1, corresponding to the LP of the memory cell. At logic state fifteen in column 450, the binary value in column 440 transitions from 1 to 0, corresponding to the TP of the memory cell. As can be seen from column 460, the distribution of page types is better balanced than the distribution obtained when using other different gray codes such as gray code (4-4-3-4).

According to examples disclosed herein, the gray code (3-4-4-4) may be used to assign pages for storing data received by the memory device. Although the examples are described with respect to a quad-layer memory cell and a four bit gray code, other gray codes having more (e.g., 5 bit, 6 bit, etc.) or less (e.g., 3 bit, 2 bit, etc.) can be applied based on the memory cell configuration. In one example, read strobes may be applied to the memory cells to detect the data. The number of read strobes may vary depending on factors such as the manner in which data is encoded, the page type used to store the data, etc.

Additionally, although the bit values are shown in FIG. 4 as one example, other bit values and variations are contemplated and fall within the scope of the present disclosure. For example, although example bit values are shown in FIG. 4, other bit values are contemplated, such as instead of having logic state zero defined by gray code bits 0000, logic state zero can be defined by gray code bits 1111, which may correspond to the binary values in columns 410, 420, 430, and 440. And, by extension, an inverse set of code bits (among other variants and examples) can also be implemented.

Figure 5:
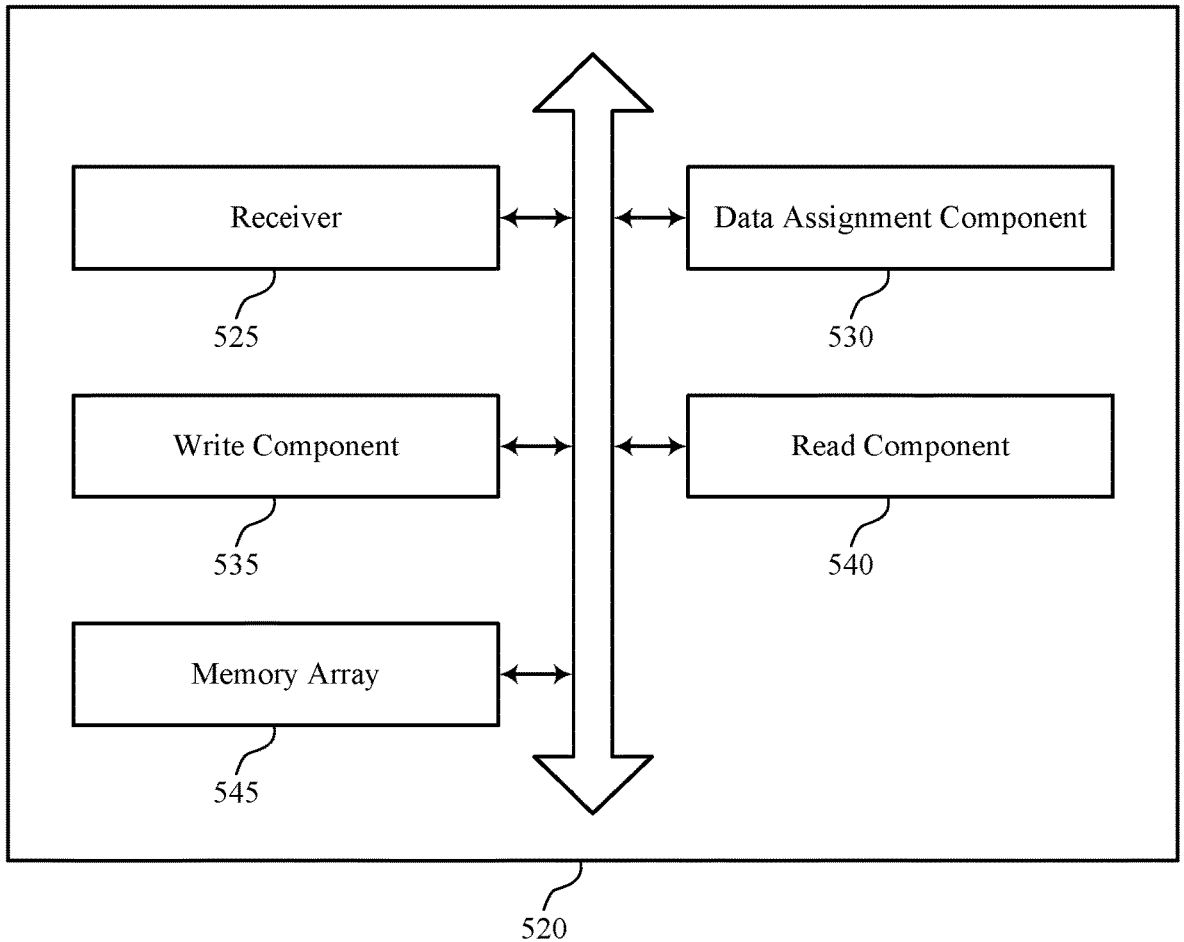
FIG. 5 shows a block diagram of a memory system that supports coding for quad-level memory cells having a replacement gate configuration in accordance with examples as disclosed herein.

FIG. 5 shows a block diagram 500 of a memory system 520 that supports coding for quad-level memory cells having a replacement gate configuration in accordance with examples as disclosed herein. The memory system 520 may be an example of aspects of a memory system as described with reference to FIGS. 1 through 4. The memory system 520, or various components thereof, may be an example of means for performing various aspects of coding for quad-level memory cells having a replacement gate configuration as described herein. For example, the memory system 520 may include a receiver 525, a data assignment component 530, a write component 535, a read component 540, a memory array 545, or any combination thereof. Each of these components may communicate, directly or indirectly, with one another (e.g., via one or more buses).

The receiver 525 may be configured as or otherwise support a means for receiving data for storage in a memory device including a memory array with memory cells having a replacement gate configuration. The data assignment component 530 may be configured as or otherwise support a means for assigning the data to a plurality of pages within a memory cell of the memory cells using a unit-distance code, where for the unit-distance code a one-bit change occurs between a representation of adjacent pages from the plurality of pages and the pages includes four page types. The write component 535 may be configured as or otherwise support a means for writing the plurality of pages within the memory cell based at least in part on assigning the data to the plurality of pages within the memory cell using the unit-distance code, where a geographic mean of one or more selected page types of the four page types having distributions in a higher voltage threshold region of the memory cell using a second unit-distance code is shifted to distributions in a lower voltage threshold region of the memory cell based at least in part on assigning the plurality of pages within the memory cell.

In some examples, the read component 540 may be configured as or otherwise support a means for applying one or more read strobes to detect a location of each of the plurality of pages within the memory cell. In some examples, the read component 540 may be configured as or otherwise support a means for reading the data stored within each of the plurality of pages within the memory cell, where a read bit error rate of the one or more selected page types of the four page types is lower than a read bit error rate for the second unit-distance code based at least in part on writing the plurality of pages within the memory cell.

In some examples, the unit-distance code includes four bits. In some examples, the memory cell is a quad layer cell.

In some examples, the four page types includes a top page, an extra page, an upper page, and a lower page. In some examples, the top page corresponds to a most significant bit of the unit-distance code and the lower page corresponds to a least significant bit of the unit-distance code.

In some examples, where the unit-distance code includes three strobes for one page type of the four page types, and four strobes for each of the other four page types within the memory cell.

In some examples, where a first digit of the unit-distance code corresponds to a lower page type of the four page types, a second digit of the unit-distance code corresponds to an upper page type of the four page types, a third digit of the unit-distance code corresponds to an extra page type of the four page types, and a fourth digit of the unit-distance code corresponds to a top page type of the four page types.

In some examples, the top page type of the four page types has only a single distribution in the highest six voltage thresholds of the memory cell.

In some examples, the unit-distance code has fifteen distributions. In some examples, the top page type of the four page types has only two distributions in the highest seven voltage thresholds of the memory cell.

In some examples, the extra page type of the four page types has two distributions in the highest six voltage thresholds of the memory cell.

In some examples, each of the four page types has a distribution in the highest four voltage thresholds of the memory cell.

In some examples, the highest six voltage thresholds of the memory cell contain less than two of any of the four page types.

In some examples, where the one page type requiring three strobes in the unit-distance code is a lower page type.

Figure 6:
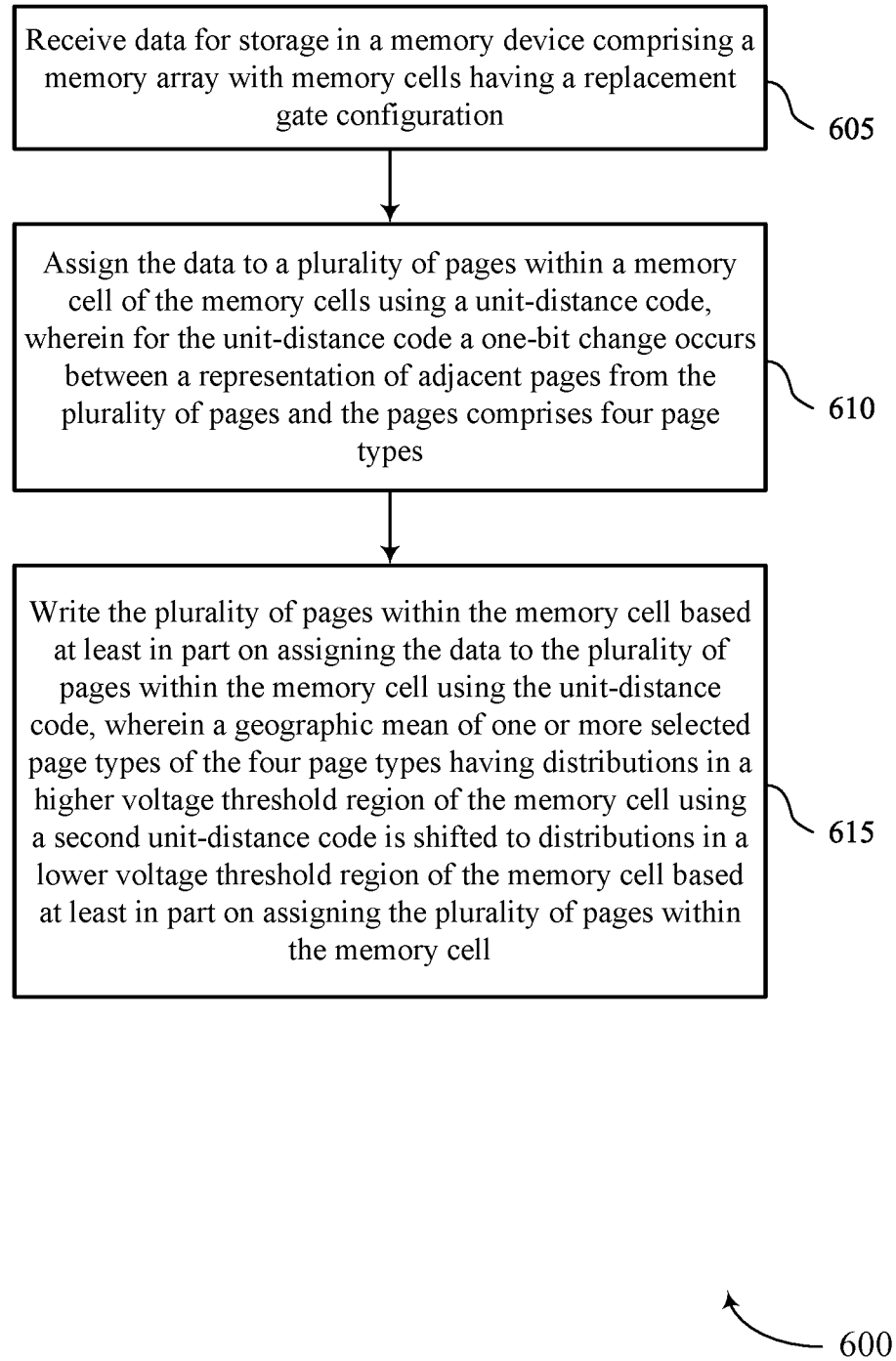
FIG. 6 shows a flowchart illustrating a method or methods that support coding for quad-level memory cells having a replacement gate configuration in accordance with examples as disclosed herein.

FIG. 6 shows a flowchart illustrating a method 600 that supports coding for quad-level memory cells having a replacement gate configuration in accordance with examples as disclosed herein. The operations of method 600 may be implemented by a memory system or its components as described herein. For example, the operations of method 600 may be performed by a memory system as described with reference to FIGS. 1 through 5. In some examples, a memory system may execute a set of instructions to control the functional elements of the device to perform the described functions. Additionally, or alternatively, the memory system may perform aspects of the described functions using special-purpose hardware.

At 605, the method may include receiving data for storage in a memory device including a memory array with memory cells having a replacement gate configuration. The operations of 605 may be performed in accordance with examples as disclosed herein. In some examples, aspects of the operations of 605 may be performed by a receiver 525 as described with reference to FIG. 5.

At 610, the method may include assigning the data to a plurality of pages within a memory cell of the memory cells using a unit-distance code, where for the unit-distance code a one-bit change occurs between a representation of adjacent pages from the plurality of pages and the pages includes four page types. The operations of 610 may be performed in accordance with examples as disclosed herein. In some examples, aspects of the operations of 610 may be performed by a data assignment component 530 as described with reference to FIG. 5.

At 615, the method may include writing the plurality of pages within the memory cell based at least in part on assigning the data to the plurality of pages within the memory cell using the unit-distance code, where a geographic mean of one or more selected page types of the four page types having distributions in a higher voltage threshold region of the memory cell using a second unit-distance code is shifted to distributions in a lower voltage threshold region of the memory cell based at least in part on assigning the plurality of pages within the memory cell. The operations of 615 may be performed in accordance with examples as disclosed herein. In some examples, aspects of the operations of 615 may be performed by a write component 535 as described with reference to FIG. 5.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving data for storage in a memory device including a memory array with memory cells having a replacement gate configuration; assigning the data to a plurality of pages within a memory cell of the memory cells using a unit-distance code, where for the unit-distance code a one-bit change occurs between a representation of adjacent pages from the plurality of pages and the pages includes four page types; and writing the plurality of pages within the memory cell based at least in part on assigning the data to the plurality of pages within the memory cell using the unit-distance code, where a geographic mean of one or more selected page types of the four page types having distributions in a higher voltage threshold region of the memory cell using a second unit-distance code is shifted to distributions in a lower voltage threshold region of the memory cell based at least in part on assigning the plurality of pages within the memory cell.

Aspect 2: The method, apparatus, or non-transitory computer-readable medium of aspect 1, further including operations, features, circuitry, logic, means, or instructions, or any combination thereof for applying one or more read strobes to detect a location of each of the plurality of pages within the memory cell and reading the data stored within each of the plurality of pages within the memory cell, where a read bit error rate of the one or more selected page types of the four page types is lower than a read bit error rate for the second unit-distance code based at least in part on writing the plurality of pages within the memory cell.

Aspect 3: The method, apparatus, or non-transitory computer-readable medium of any of aspects 1 through 2, where the unit-distance code includes four bits and the memory cell is a quad layer cell.

Aspect 4: The method, apparatus, or non-transitory computer-readable medium of aspect 3, where the four page types includes a top page, an extra page, an upper page, and a lower page and the top page corresponds to a most significant bit of the unit-distance code and the lower page corresponds to a least significant bit of the unit-distance code.

Aspect 5: The method, apparatus, or non-transitory computer-readable medium of any of aspects 1 through 4, where the unit-distance code includes three strobes for one page type of the four page types, and four strobes for each of the other four page types within the memory cell.

Aspect 6: The method, apparatus, or non-transitory computer-readable medium of aspect 5, where a first digit of the unit-distance code corresponds to a lower page type of the four page types, a second digit of the unit-distance code corresponds to an upper page type of the four page types, a third digit of the unit-distance code corresponds to an extra page type of the four page types, and a fourth digit of the unit-distance code corresponds to a top page type of the four page types.

Aspect 7: The method, apparatus, or non-transitory computer-readable medium of aspect 6, where the top page type of the four page types has only a single distribution in the highest six voltage thresholds of the memory cell.

Aspect 8: The method, apparatus, or non-transitory computer-readable medium of any of aspects 6 through 7, where the unit-distance code has fifteen distributions and the top page type of the four page types has only two distributions in the highest seven voltage thresholds of the memory cell.

Aspect 9: The method, apparatus, or non-transitory computer-readable medium of any of aspects 6 through 8, where the extra page type of the four page types has two distributions in the highest six voltage thresholds of the memory cell.

Aspect 10: The method, apparatus, or non-transitory computer-readable medium of any of aspects 6 through 9, where each of the four page types has a distribution in the highest four voltage thresholds of the memory cell.

Aspect 11: The method, apparatus, or non-transitory computer-readable medium of any of aspects 6 through 10, where the highest six voltage thresholds of the memory cell contain less than two of any of the four page types.

Aspect 12: The method, apparatus, or non-transitory computer-readable medium of any of aspects 5 through 11, where the one page type requiring three strobes in the unit-distance code is a lower page type.

It should be noted that the described techniques include possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally, or alternatively (e.g., in an alternative example), be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   receiving data for storage in one or more memory devices comprising one or more memory arrays, the one or more memory arrays comprising a plurality of memory cells having a replacement gate configuration;
   assigning the data to a plurality of pages within a memory cell of the plurality of memory cells according to a unit-distance code, each page of the plurality of pages associated with a respective bit of the data, the plurality of pages comprising four page types, wherein a one-bit change occurs between each adjacent page type of the four page types in accordance with the unit-distance code, wherein each page type of the four page types is associated with a respective quantity of read strobes applied for detection of a corresponding page, wherein assigning the data according to the unit-distance code comprises coding a respective bit value to each page type of the four page types according to a plurality of voltage thresholds of the memory cell, and wherein the unit-distance code indicates at least one change in the respective bit value for each page type of the four page types at a respective voltage threshold of a highest four voltage thresholds of the plurality of voltage thresholds of the memory cell;

writing the plurality of pages within the memory cell based at least in part on assigning the data to the plurality of pages within the memory cell according to the unit-distance code; and applying one or more read strobes to detect a location of each page of the plurality of pages, wherein three read strobes are applied to a first set of pages, of the plurality of pages, that is associated with a lowest page type of the four page types and four read strobes are applied to a second set of pages, of the plurality of pages, that is associated with a top-most page type of the four page types.

2. The method of claim 1, further comprising:
reading the data stored within each of the plurality of pages within the memory cell, wherein applying the one or more read strobes to detect the location of each page of the plurality of pages is based at least in part on reading the data.

3. The method of claim 1, wherein:
the unit-distance code comprises four bits, and
the memory cell is a quad layer cell.

4. The method of claim 3, wherein:
the four page types comprise the top-most page type, an extra page type, an upper page type, and the lowest page type, and
the top-most page type corresponds to a most significant bit of the unit-distance code and the lowest page type corresponds to a least significant bit of the unit-distance code.

5. The method of claim 1, wherein applying the one or more read strobes comprises:
applying the three read strobes to the first set of pages associated with the lowest page type of the four page types; and
applying the four read strobes to respective sets of pages associated with each other page type of the four page types.

6. The method of claim 5, wherein a first bit of the unit-distance code corresponds to the lowest page type of the four page types, a second bit of the unit-distance code corresponds to an upper page type of the four page types, a third bit of the unit-distance code corresponds to an extra page type of the four page types, and a fourth bit of the unit-distance code corresponds to the top-most page type of the four page types.

7. The method of claim 6, wherein:
the unit-distance code indicates that the top-most page type of the four page types has a single bit value change at a single voltage threshold of a highest six voltage thresholds of the plurality of voltage thresholds of the memory cell based at least in part on the assigning of the data to the plurality of pages within the memory cell according to the unit-distance code.

8. The method of claim 6, wherein:
the unit-distance code indicates that the top-most page type of the four page types has two bit value changes at two respective voltage thresholds of a highest seven voltage thresholds of the plurality of voltage thresholds of the memory cell based at least in part on the assigning of the data to the plurality of pages within the memory cell according to the unit-distance code.

9. The method of claim 6, wherein:
the unit-distance code indicates that the extra page type of the four page types has two bit value changes at two respective voltage thresholds of a highest six voltage thresholds of the plurality of voltage thresholds of the memory cell based at least in part on the assigning of the data to the plurality of pages within the memory cell according to the unit-distance code.

10. The method of claim 6, wherein:
the unit-distance code indicates that less than two page types of any of the four page types have at least one bit value change at a respective voltage threshold of a highest six voltage thresholds of the plurality of voltage thresholds of the memory cell based at least in part on the assigning of the data to the plurality of pages within the memory cell according to the unit-distance code.

11. A memory system, comprising:
one or more memory devices comprising one or more memory arrays, the one or more memory arrays comprising a plurality of memory cells having a replacement gate configuration; and
processing circuitry coupled with the one or more memory devices and configured to cause the memory system to:
receive data for storage in the one or more memory devices;
assign the data to a plurality of pages within a memory cell of the plurality of memory cells according to a unit-distance code, each page of the plurality of pages associated with a respective bit of the data, the plurality of pages comprising four page types, wherein a one-bit change occurs between each adjacent page type of the four page types in accordance with the unit-distance code, wherein each page type of the four page types is associated with a respective quantity of read strobes applied for detection of a corresponding page, wherein assigning the data according to the unit-distance code comprises coding a respective bit value to each page type of the four page types according to a plurality of voltage thresholds of the memory cell, and wherein the unit-distance code indicates at least one change in the respective bit value for each page type of the four page types at a respective voltage threshold of a highest four voltage thresholds of the plurality of voltage thresholds of the memory cell;
write the plurality of pages within the memory cell based at least in part on assigning the data to the plurality of pages within the memory cell according to the unit-distance code; and
apply one or more read strobes to detect a location of each page of the plurality of pages, wherein three read strobes are applied to a first set of pages, of the plurality of pages, that is associated with a lowest page type of the four page types and four read strobes are applied to a second set of pages, of the plurality of pages, that is associated with a top-most page type of the four page types.

12. The memory system of claim 11, wherein the processing circuitry is further configured to cause the memory system to:
read the data stored within each of the plurality of pages within the memory cell, wherein applying the one or more read strobes to detect the location of each page of the plurality of pages is based at least in part on reading the data.

13. The memory system of claim 11, wherein:
the unit-distance code comprises four bits, and
the memory cell is a quad layer cell.

14. The memory system of claim 13, wherein:
the four page types comprise the top-most page type, an extra page type, an upper page type, and the lowest page type, and
the top-most page type corresponds to a most significant bit of the unit-distance code and the lowest page type corresponds to a least significant bit of the unit-distance code.

15. The memory system of claim 11, wherein, to apply the one or more read strobes, the processing circuitry is configured to cause the memory system to:
apply the three read strobes to the first set of pages associated with the lowest page type of the four page types; and
apply the four read strobes to respective sets of pages associated with each other page type of the four page types.

16. The memory system of claim 15,
wherein a first bit of the unit-distance code corresponds to the lowest page type of the four page types, a second bit of the unit-distance code corresponds to an upper page type of the four page types, a third bit of the unit-distance code corresponds to an extra page type of the four page types, and a fourth bit of the unit-distance code corresponds to the top-most page type of the four page types.

17. The memory system of claim 16, wherein:
the unit-distance code indicates that the top-most page type of the four page types has a single bit value change at a single voltage threshold of a highest six voltage thresholds of the plurality of voltage thresholds of the memory cell based at least in part on the assigning of the data to the plurality of pages within the memory cell according to the unit-distance code.

18. The memory system of claim 16, wherein:
the unit-distance code indicates that the top-most page type of the four page types has two bit value changes at two respective voltage thresholds of a highest seven voltage thresholds of the plurality of voltage thresholds of the memory cell based at least in part on the assigning of the data to the plurality of pages within the memory cell according to the unit-distance code.

19. The memory system of claim 16, wherein:
the unit-distance code indicates that the extra page type of the four page types has two bit value changes at two respective voltage thresholds of a highest six voltage thresholds of the plurality of voltage thresholds of the memory cell based at least in part on the assigning of the data to the plurality of pages within the memory cell according to the unit-distance code.

20. The memory system of claim 16, wherein:
the unit-distance code indicates that less than two page types of any of the four page types have at least one bit value change at a respective voltage threshold of a highest six voltage thresholds of the plurality of voltage thresholds of the memory cell based at least in part on the assigning of the data to the plurality of pages within the memory cell according to the unit-distance code.

* * * * *